United States Patent [19]
Wang et al.

[11] Patent Number: 5,838,267
[45] Date of Patent: Nov. 17, 1998

[54] METHOD AND APPARATUS FOR ENCODING AND DECODING DIGITAL INFORMATION

[75] Inventors: Yi-Pin Eric Wang, Raleigh; Sandeep Chennakeshu, Cary; Paul W. Dent, Pittsboro; Kumar Balachandran, Cary, all of N.C.

[73] Assignee: Ericsson, Inc., Research Triangle Park, N.C.

[21] Appl. No.: 728,158

[22] Filed: Oct. 9, 1996

[51] Int. Cl.⁶ .............................. G06F 11/00; H03M 13/00
[52] U.S. Cl. .............................................. 341/94; 341/107
[58] Field of Search ............................ 341/145, 118–121, 341/106, 107, 94

[56] References Cited

U.S. PATENT DOCUMENTS

| | | | |
|---|---|---|---|
| 3,824,590 | 7/1974 | Limb | 340/347 |
| 4,222,107 | 9/1980 | Mrozowski et al. | 364/571 |
| 4,412,208 | 10/1983 | Akazawa | 340/347 |
| 4,926,169 | 5/1990 | Tong et al. | 340/825.7 |
| 4,933,956 | 6/1990 | Forney, Jr. | 375/94 |
| 5,072,358 | 12/1991 | Lankford | 364/178 |
| 5,247,579 | 9/1993 | Hardwick et al. | 381/40 |
| 5,321,703 | 6/1994 | Weng | 371/36 |
| 5,341,384 | 8/1994 | Miya et al. | 371/31 |
| 5,373,511 | 12/1994 | Veksler | 371/31.4 |
| 5,412,724 | 5/1995 | Mary | 380/20 |
| 5,457,712 | 10/1995 | Weerackody | 375/347 |
| 5,634,083 | 5/1997 | Oerder | 395/2.62 |

FOREIGN PATENT DOCUMENTS

| | | | |
|---|---|---|---|
| 2216752 | 2/1989 | United Kingdom | H03M 13/00 |
| PCT/01050 | 3/1989 | WIPO . | |
| WO 96/27963 | 3/1996 | WIPO . | |

OTHER PUBLICATIONS

Wicker, Stephen B.; "Adaptive Rate Error Control Through The Use of Diversity Combining and Majority–Logic Decoding in a Hybrid–ARQ Protocol;" IEEE Transactions on Communications, vol. 39, No. 3, Mar. 1991 pp. 380–385.

Masayoshi Miyagi, Tadafusa Niinomi, Iwao Sasase, and Shinsaku Mori; "Selective Repeat Type–II Hybrid FEC/ARQ Systems Using Concatenated Codes;" Electronics and Communications in Japan, No. 6, Jun. 1993, pp. 25–34.

Primary Examiner—Marc S. Hoff
Assistant Examiner—Peguy JeanPierre
Attorney, Agent, or Firm—Rhodes, Coats & Bennett, L.L.P.

[57] ABSTRACT

A method for encoding and decoding the digital information sequence uses a combination of two block codes to simultaneously correct and detect errors. The information sequence is encoded by a first stage of the encoder to produce an information code word including an information vector and a primary redundancy vector. The primary redundancy vector is encoded in a second stage of the encoder to obtain a redundancy code word. The information code word and redundancy code word are interleaved and transmitted to the receiver. At the receiver, the information code word and redundancy code word are decoded in a first stage of the decoder to obtain a first estimate of the information code word. The first estimate of the information code word is decoded in the second stage of the decoder to produce a second estimate of the information code word. The distance between the first and second estimates of the information code word is evaluated. If the distance is more than one, the received code word is erased. In another embodiment, the information sequence is repeated at the receiver. Each repetition includes a parity check resulting from the same code or from different codes. The received information vectors are selectively combined and then individually decoded using the individual parity vectors to generate multiple estimates of the information sequence. The estimates are then combined using hard or soft combining techniques.

27 Claims, 6 Drawing Sheets

METHOD AND APPARATUS FOR ENCODING AND DECODING DIGITAL INFORMATION

BACKGROUND OF THE INVENTION

In recent years, there has been an increasing demand for efficient and reliable digital communication systems. The transmission of digital information is subject to adverse effects the communication channel, such as noise, distortions, and fading. These effects introduce errors, called channel errors, into the transmitted data stream. These effects are particularly severe in a radio communication system. The error probability in the received binary sequence is one of the most important design parameters in a radio communication link.

In 1948, Claude E. Shannon demonstrated in a landmark paper that by proper encoding of the digital information, errors introduced by a noisy channel can be reduced to any desired level without sacrificing the rate of information transmission. Since then, a great deal of research has been devoted to developing efficient encoding and decoding methods for error control in noisy channels. These developments have now reached the point that reliable digital radio communication systems are possible. The use of coding for error control is now an integral part of the design of modern digital radio communication systems.

In GSM, there is a myriad of coding schemes for protecting data transmitted through the RF channel. Different coding schemes are used for different logical channels. Traffic channels which are used to transmit voice messages, for example, require less protection than traffic channels used to transmit user data. Therefore, speech channels often employ high rate codes. Control channels used to transmit signalling data require even greater protection which requires lower code rates. The lower code rates add to the coding overhead and increase bandwidth requirements. Therefore, it is desirable to develop more effective codes that cain provide the desired degree of error protection with a minimum increase in coding overhead.

For many control channels, data is channel-coded in two steps. The signalling data is block coded prior to convolutional coding. The convolutional code therefore doubles the numbers of bits to be transmitted. While this two-step coding scheme works effectively in control channels where long sequences are transmitted, it is less than ideal for control channels, such as the random access channel (RACH), where only short sequences are transmitted. It is not efficient to use convolutional codes for short data sequences. Block codes generally have a better Hamming distance than convolutional codes. Further, the cyclic codes commonly used do not permit soft decoding so that the input to the decoder is hard limited.

SUMMARY OF THE INVENTION

The present invention is an error detecting and correction system used for error control in a radio communication system. The error detection and correction system is particularly useful for error protection of short data sequences. The error detection and control system includes a transmitter encoder for coding a digital information sequence prior to transmission, and a receiver decoder for decoding a received sequence to recreate the original information sequence. The original information sequence is encoded to produce an information code word including an information vector and a primary redundancy vector. The primary redundancy vector is then coded to produce a redundancy code word including the primary redundancy vector and a secondary redundancy vector. The information code word and redundancy code word are combined and transmitted.

The receiver includes a primary information decoder for soft decoding the received information code word to produce an initial estimated information vector. A redundancy decoder soft decodes the received redundancy code word to produce an estimated primary redundancy vector. The initial estimates of the information vector and primary redundancy vectors are then hard decoded by a secondary information decoder to produce a second estimated information code word. The first and second estimates of the information code worn are compared to determine the Hamming distance between them. If the Hamming distance is more than a predetermined value, the secondary information decoder fails causing the received code words to be erased.

The two step decoding process has several advantages over the coding schemes currently in use for the random access channel. First, the present invention employs nested block codes which can produce highly effective error control without increasing coding overhead. The nested block code scheme of the present invention can have a code rate of ⅓ or ¼. Secondly, the nested block code scheme provides greater flexibility than previous coding schemes. The present invention may, for example, use soft-decision decoding to take into account reliability factors. One final advantage is a significant reduction in the residual bit error rate and frame erasure rate as compared to the coding schemes previously employed.

In an alternate embodiment, the information codeword is transmitted multiple times to the receiver station. The received information vectors are selectively combined and/or routed to a series of parallel decoders. The information vectors are then individually decoded to generate multiple estimates of the information sequence. The resulting estimates of the information sequence are combined to generate a final estimate.

Other objects and advantages of the present invention will become apparent and obvious from a study of the following description and the accompanying drawings which are merely illustrative of such invention.

DETAILED DESCRIPTION OF THE INVENTION

Figure 1:
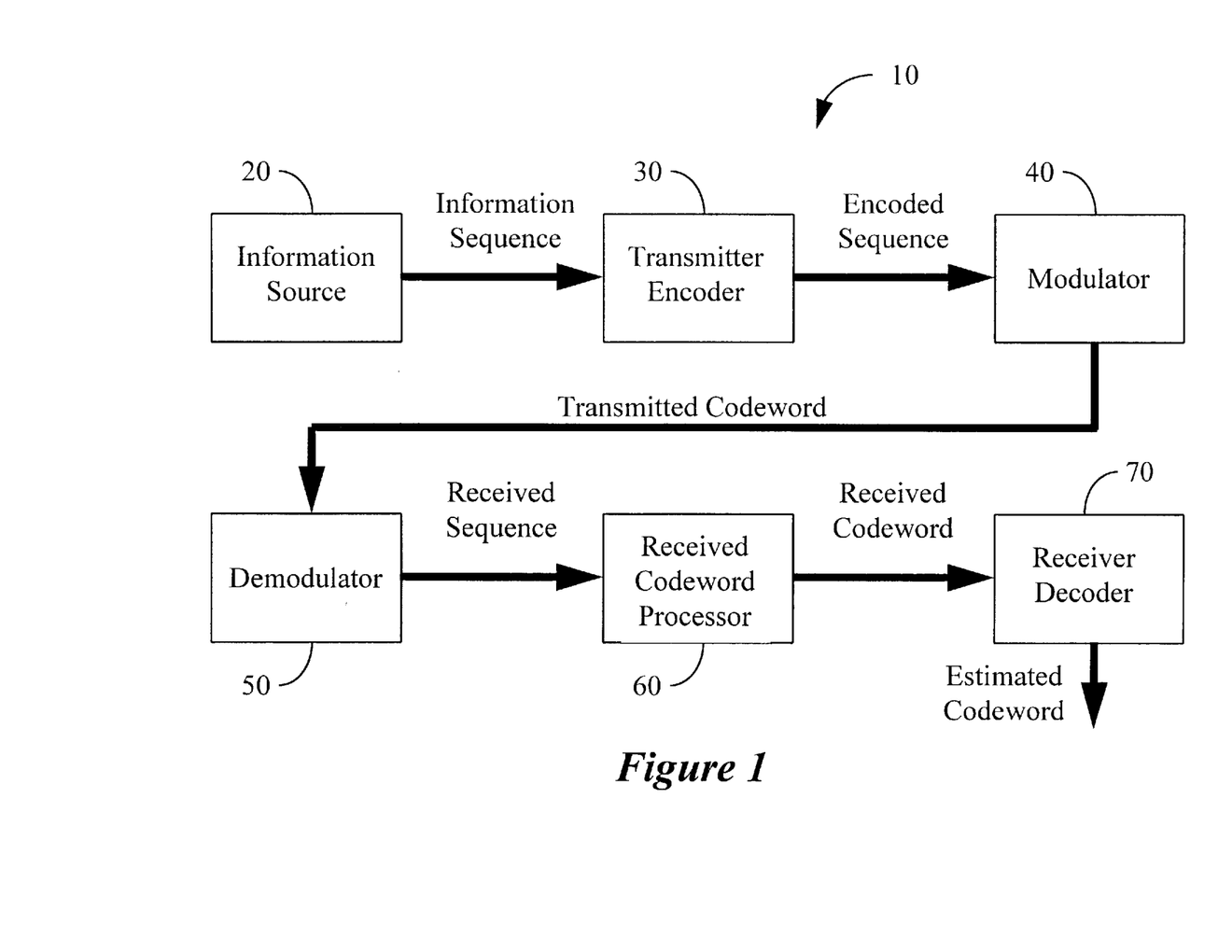
FIG. 1 is a block diagram of a data transmission system.

Referring now to the drawings, and particularly to FIG. 1, the data transmission system of the present invention is indicated generally by the numeral 10. The data transmission system 10 includes an information source 20, a transmitter encoder 30, a modulator 40, a demodulator 50, a received code word processor 60, and a receiver decoder 70.

The information source 20 can be of analog form or a digital bit sequence. If it is of analog form, it can be sampled and quantized to produce the necessary digital bit sequence. The sequence, however, may not be directly suitable for channel encoding or for modulating the carrier of the data communications system. Under such circumstances, source coding is applied to restructure the data sequence to make it compatible with the channel requirements. The source encoder codes the information so as to reduce the redundancy of the source data. This is often called "data compression." The consequence of this will be shorter bit sequences and so more messages can be sent or stored in a given allocation. The output of the information source 20 is called the information sequence.

The transmitter encoder 30 transforms the information sequence from the information source into a discrete encoded sequence called a code word. This type of encoding is called channel encoding and refers to the data transformation, performed after source encoding but prior to modulation, that transforms source bits into channel bits.

Channel encoding can be of two forms; waveform coding and structured sequential coding. Waveform coding transforms the source data and renders the detection process less subject to errors and thereby improves transmission performance. Structured sequential coding (linear block coding) represents a method of inserting structured redundancy into the source data so that transmission or channel errors can be identified and corrected. Structured sequences are one of two types: block coding and convolutional coding.

The data transmission system 10 of the present invention uses block coding wherein the source data is first segmented into blocks of k data bits each. Each block can represent any one of $m=2^k$ distinct messages. The channel encoder takes each block of k input bits and encodes them to n output bits. The set of $2^k$ coded messages is called a code block. The (n-k) bits that are added by the encoding process are called redundant bits and carry no new information. The ratio k/n is defined as the code rate, and the code is called an (n,k) code.

The redundant information added by the encoder 30 is used to protect the information sequence against errors which occur during transmission. This is known as error control coding. The redundant bit stream is calculated from the information sequence (e.g. by parity check on modulo-2 addition). Thus, a dependency or correlation is developed between the original information sequence and the redundancy bit stream. The dependence is exploited by the decoder to detect and correct errors that are generated in the channel environment. The redundant bits are often called parity bits.

The modulator 40 combines the code word from the transmitter encoder 30 with a carrier signal to render it suitable for transmission. In digital systems, the data bits of the entire information message, which include start, stop, preamble, and postamble bits, are interfaced to the communication channel at the physical level. Once the bit stream is encoded, formatted, and made ready for actual transmission, it must be made compatible with the channel characteristics. This channel compatibility is facilitated by a transformation of the digital information to a time variable waveform.

The modulator 40 provides a transformation from a digital data stream to a waveform representation of that data, which can be accepted by a waveform channel. Such a channel is optimized to satisfy a constraint in the transmission power. The choice of technique (AM, FM, or PM), or combinations of techniques, depends in general on the error performance criterion, the bandwidth efficiency, and the complexity of the required signal processing.

The modulation technique specified for GSM is GMSK. GMSK is a type of constant envelope FSK where the frequency modulation is a result of carefully contrived phase modulation. Thus, there is a distinct lack of AM in the carrier with a consequent limiting of the occupied bandwidth. The present invention preferably employs GMSK modulation with non-Nyquist filters.

The modulated signal is transmitted via a communication channel, such as a radio communication channel. The communication channel is subject to certain adverse influences, such as noise that change the modulated signal.

At the receiver, the received waveform is processed by the demodulator 50. The demodulator 50 produces an output that may be discrete (quantized) or continuous (unquantized). The sequence of demodulator outputs corresponding to the encoded sequence is called the received sequence.

The received code word processor 60 and receiver decoder 70 transform the received sequence into a binary sequence which ideally will be a replica of the original information sequence. The received sequence will frequently contain channel errors introduced by noise or other adverse affects of the channel environment. The decoder 70 makes use of the redundant information added by the transmitter encoder 30 and knowledge of the coding scheme to detect and correct any channel errors.

Figure 2:
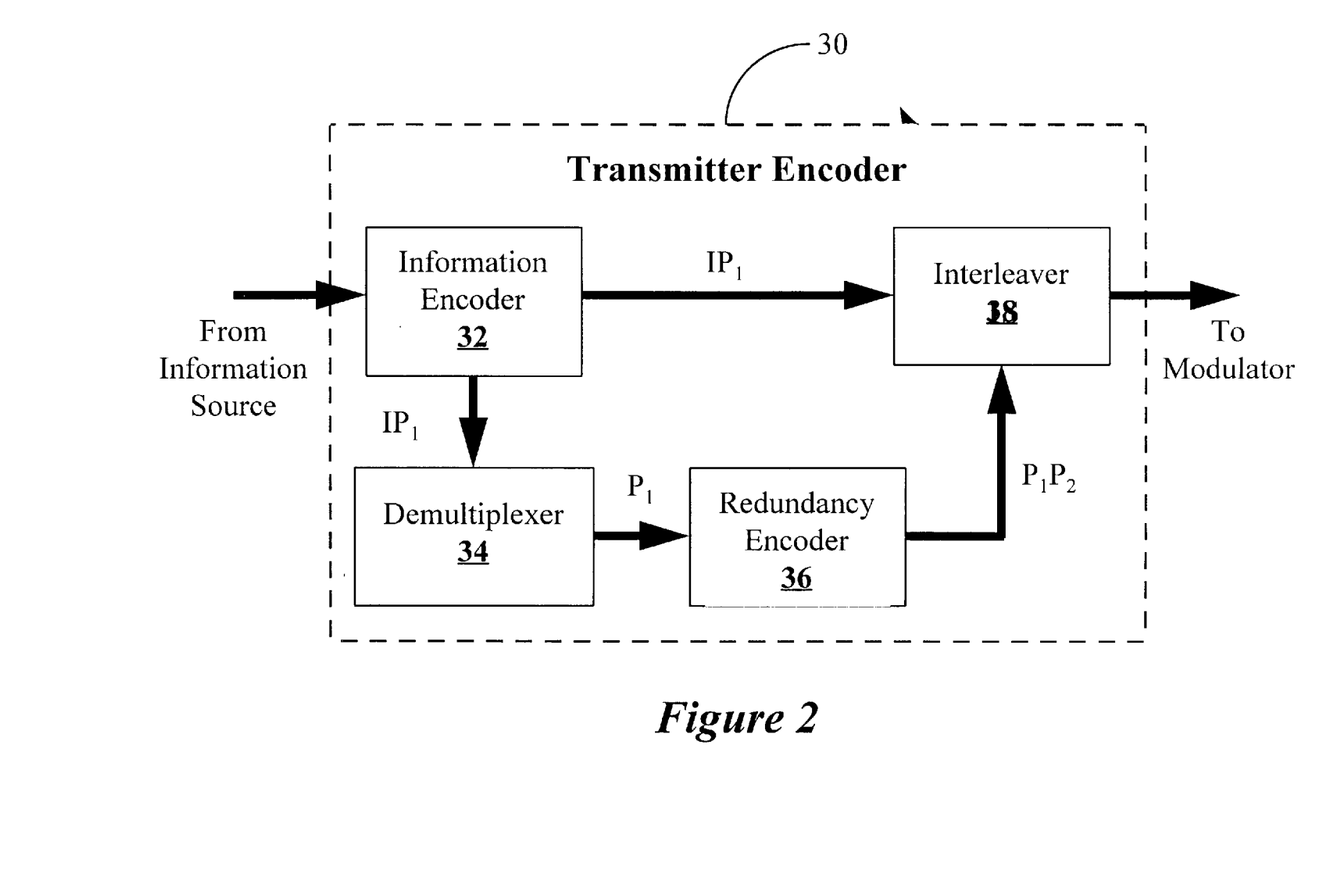
FIG. 2 is a block diagram of the transmitter encoder.
Figure 3:
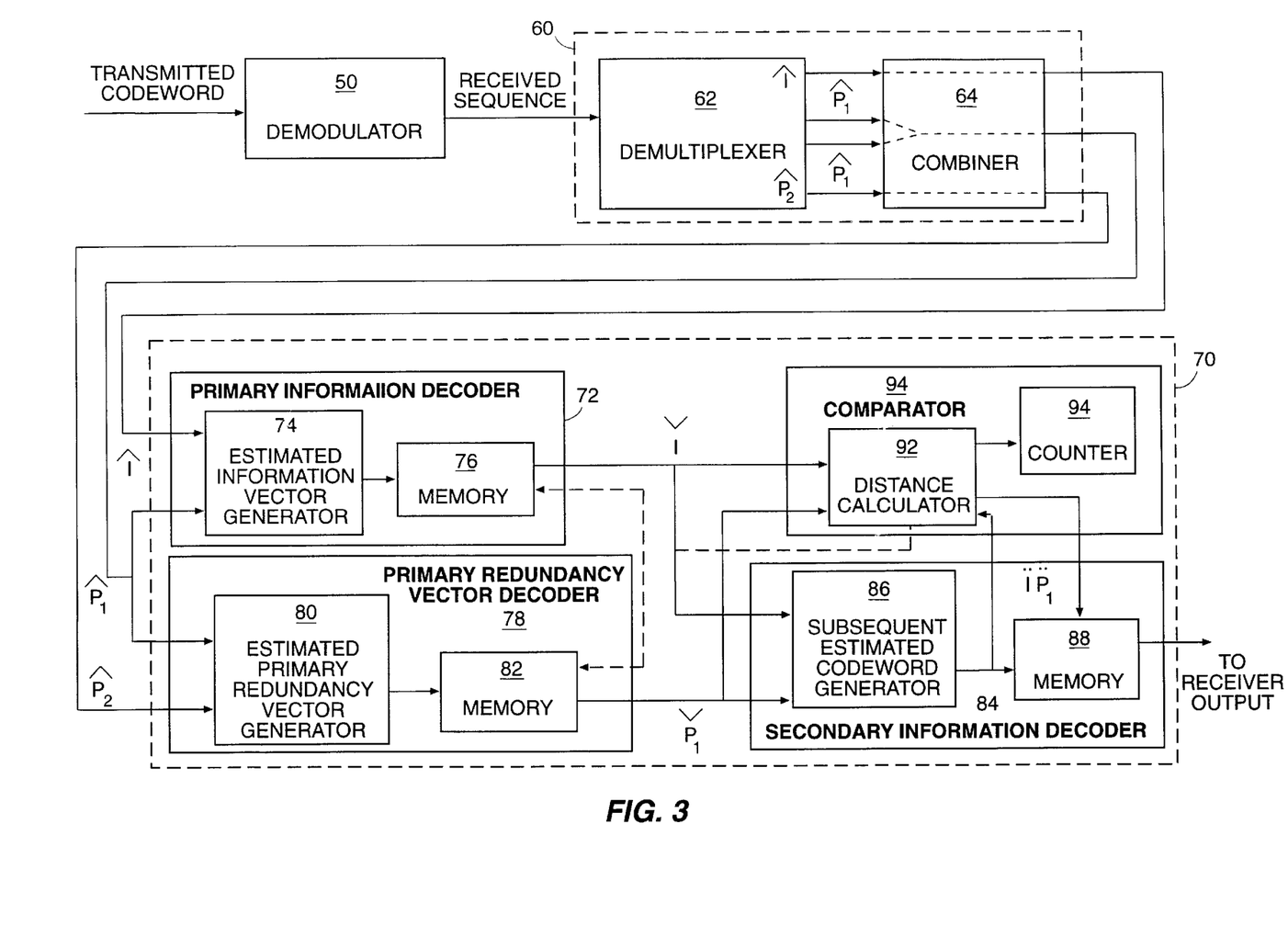
FIG. 3 is a block diagram of the code word processor and receiver decoder.

The data transmission system 10 employs a combination of two block codes for error control of the transmitted data. FIGS. 2 and 3 illustrate a preferred embodiment of the transmitter encoder 30 and receiver decoder 70, respectively, which employ the nested block code scheme.

Referring now to FIG. 2, there is shown a block diagram of the transmitter encoder 30 employing two nested (n,k,) block codes. The transmitter encoder 30 includes an information encoder 32, a demultiplexer 34, a redundancy encoder 36, and a block-rectangular interleaver 38.

The function of the information encoder 32 is to encode the information sequence received from the information source 20. The information encoder 22 encodes the information sequence/in such a way as to introduce redundant information that can be used by the decoder 70 to detect and/or correct errors. The output of the information encoder 22 is an information code word including the original information sequence or information vector I and an information parity bit stream $P_1$ which is derived from the information vector space. The derivation is based on a prescribed linear combination of the information vectors. The information parity bit stream $P_1$ is also called the primary redundancy vector.

The code used by the information encoder 32 is preferably an (n,k) block code. In a preferred embodiment, a systematic (24,12) Golay code is used to encode a 12-bit information sequence. A (24,12) Golay code is used primarily because of its long minimum Hamming distance which results in the ability to detect seven errors or correct up to three errors. Other (n,k) block codes may also be used.

The information code word $IP_1$ output from the information encoder is fed to a block-rectangular interleaver 38 and to a demutiplexer 34. The demultiplexer 34 strips off the information parity bit stream $P_1$ from the information code word $IP_1$. The information parity bit stream $P_1$ is then fed to the redundancy encoder 36 which produces a redundancy code word by adding secondary parity bits ($P_2$) to the information parity bits ($P_1$). This redundancy code word $P_1P_2$ comprises the information parity bit stream $P_1$ and an appended bit stream $P_2$ which is derived from a linear combination of the vectors within the $P_1$ vector space. The redundancy encoder also employs a (24,12) Golay code. The redundancy code word $P_1P_2$ is then fed to the interleaver 38 to which the information code word $IP_1$ is fed.

Figure 4:
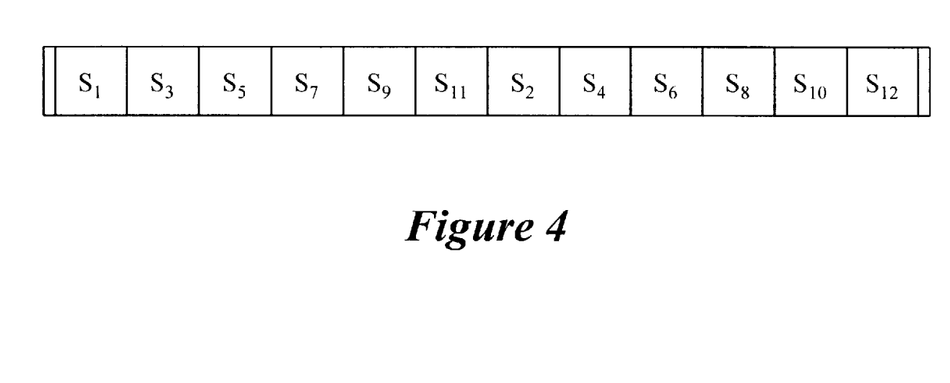
FIG. 4 is a diagram illustrating the bit positioning scheme used by the transmitter encoder.

The interleaver 38 interleaves the information code word $IP_1$, and the redundancy code word $P_1P_2$ for subsequent transmission to the receiver. To obtain the best performance, the bit positioning scheme shown in FIG. 4 is used. $S_j$ represents a series of three-bit vectors. Where a code rate of ⅓ is used, $S_j$ is a vector consisting of the jth bit of $I,P_1$, and $P_2$ respectively. For a code rate of ¼, the jth bit of $P_1$ is repeated twice in $S_j$.

Referring now to FIG. 3, the receiver is shown in greater detail. The receiver includes a code word processor 60 and a decoder 70. The demodulator 50 feeds the received sequence to the code word processor 60. The code word processor 60 includes a demultiplexer 62 and a vector combiner 64. The demultiplexer 62 extracts the received vector, $\hat{I},\hat{P}_1,\hat{P}_2$ from the received sequence. Where a code rate of ¼ is used, the output of the demultiplexer includes two instances of the information parity bit vector $\hat{P}_1$. The vector combiner 64 combines the two instances of the information parity bit vector $\hat{P}_1$ to produce a single instance which is used in the decoding operation. The vectors $\hat{I},\hat{P}_1,\hat{P}_2$ are then fed to the receiver decoder 70 for processing.

The receiver decoder 70 comprises the primary information vector decoder 72, the primary redundancy vector decoder 78, the secondary information vector decoder 84, and a comparator 90.

The received information vector $\hat{I}$ and the received information parity bit stream $\hat{P}_1$ are fed to the primary information vector decoder 72 which includes an estimated information vector generator 74 and an internal memory 76. The vector generator 74 soft decodes the vectors $\hat{I}$ and $\hat{P}_1$ to produce an estimate $\check{I}$ of the information vector. Preferably, multiple estimates $\check{I}$ of the information vector are generated and stored in the memory 76 in the order of their likelihood of being correct.

The information parity bit stream vector $\hat{P}_1$, is also fed to the primary redundancy vector decoder 78 along with the secondary parity bit vector $\hat{P}_2$. The primary redundancy vector decoder 78 includes a estimated primary redundancy vector generator 80 and a memory 82. The information parity bit stream vector $\hat{P}_1$, and the redundancy parity bit vector $\hat{P}_2$ are soft decoded by a soft Golay code to produce an estimate $\check{P}_1$ of the information parity bit stream $\check{P}_1$. Preferably, multiple estimates of the information parity bit stream $\check{P}_1$ are calculated and stored in the memory 82 in the order of the likelihood of being correct.

The estimated information vector $\check{I}$ and the estimated information parity bit stream $\check{P}_1$ are fed to the secondary information decoder 84 which includes a code word generator 86 and a memory 88. The code word generator 86 processes decodes the first estimate to produce a final estimate $\ddot{I}\ \ddot{P}_1$. The final estimate $\ddot{I}\ \ddot{P}_1$ is fed, along with the first estimate $\check{I}\ \check{P}_1$ to the comparator 90. The comparator 90 includes a distance calculator 92 which calculates the Hamming distance between $\ddot{I}\ \ddot{P}_1$ and $\check{I}\ \check{P}_1$. If Hamming distance between $\ddot{I}\ \ddot{P}_1$ and $\check{I}\ \check{P}_1$ is more than a predetermined value, an erasure signal is generated by the comparator 90 and applied to the secondary information decoder 84 causing the received code word to be erased.

Alternatively, the comparator 90 could signal the inner decoders 72 and 78 of the failure which would cause the inner decoders 72, 78 to output other likely code words in decreasing order of probability corresponding to $IP_1$ and $P_1P_2$ which are stored in their respective memories 76, 82. The failure signal is shown as a dotted line in FIG. 3. If other likely code words exist, the revised estimated code words $\check{I}$ and $\check{P}_1$ are again fed to the outer decoder 84 which repeats the process as outlined above. The process can be repeated any designated number of time and a count is kept by a counter 94 forming a part of the comparator 90. If the outer decoder 84 fails after n trials, the erasure signal is generated.

Figure 5:
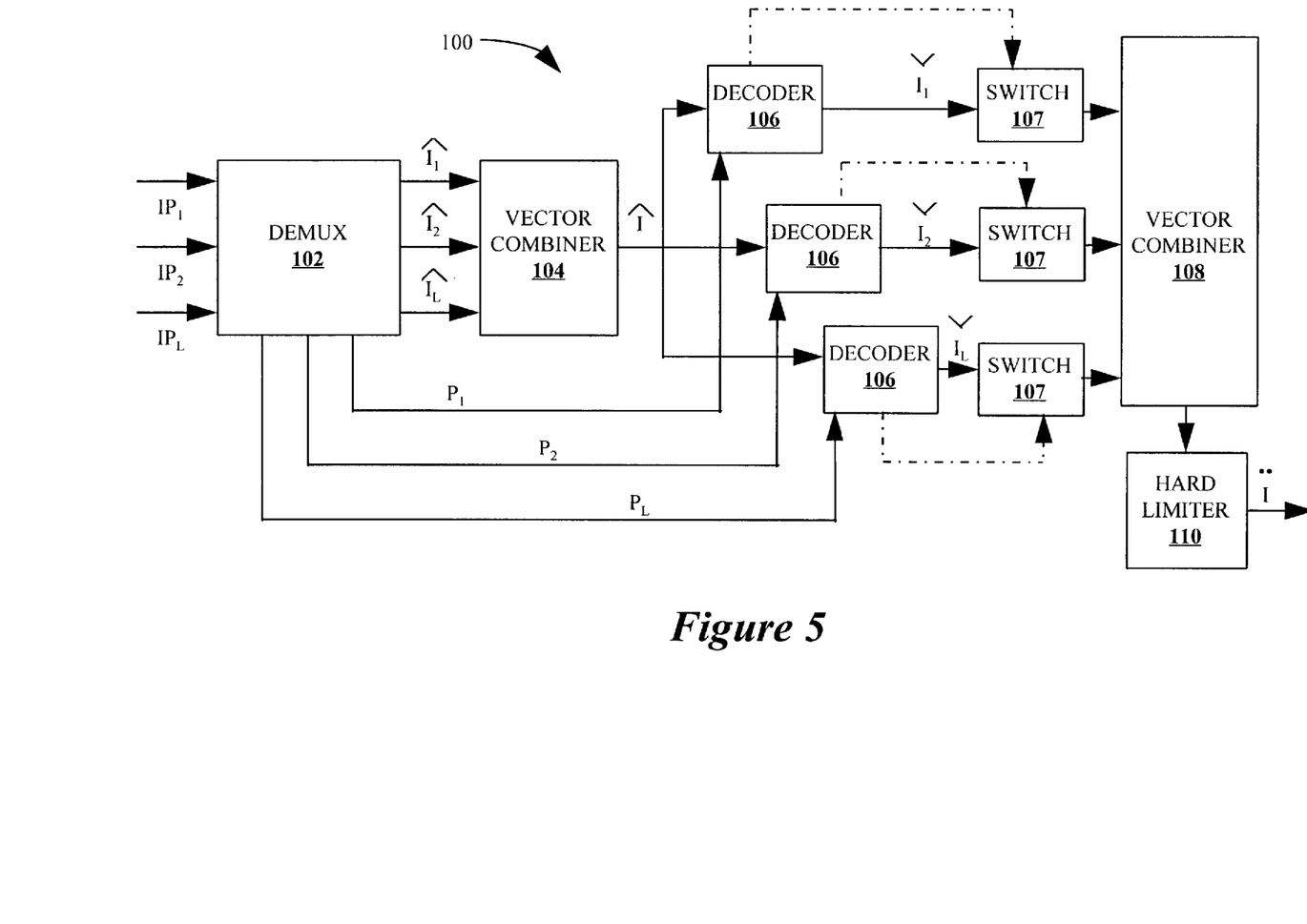
FIG. 5 is a block diagram showing an alternate design for the receiver decoder using a parallel block coding scheme.
Figure 6:
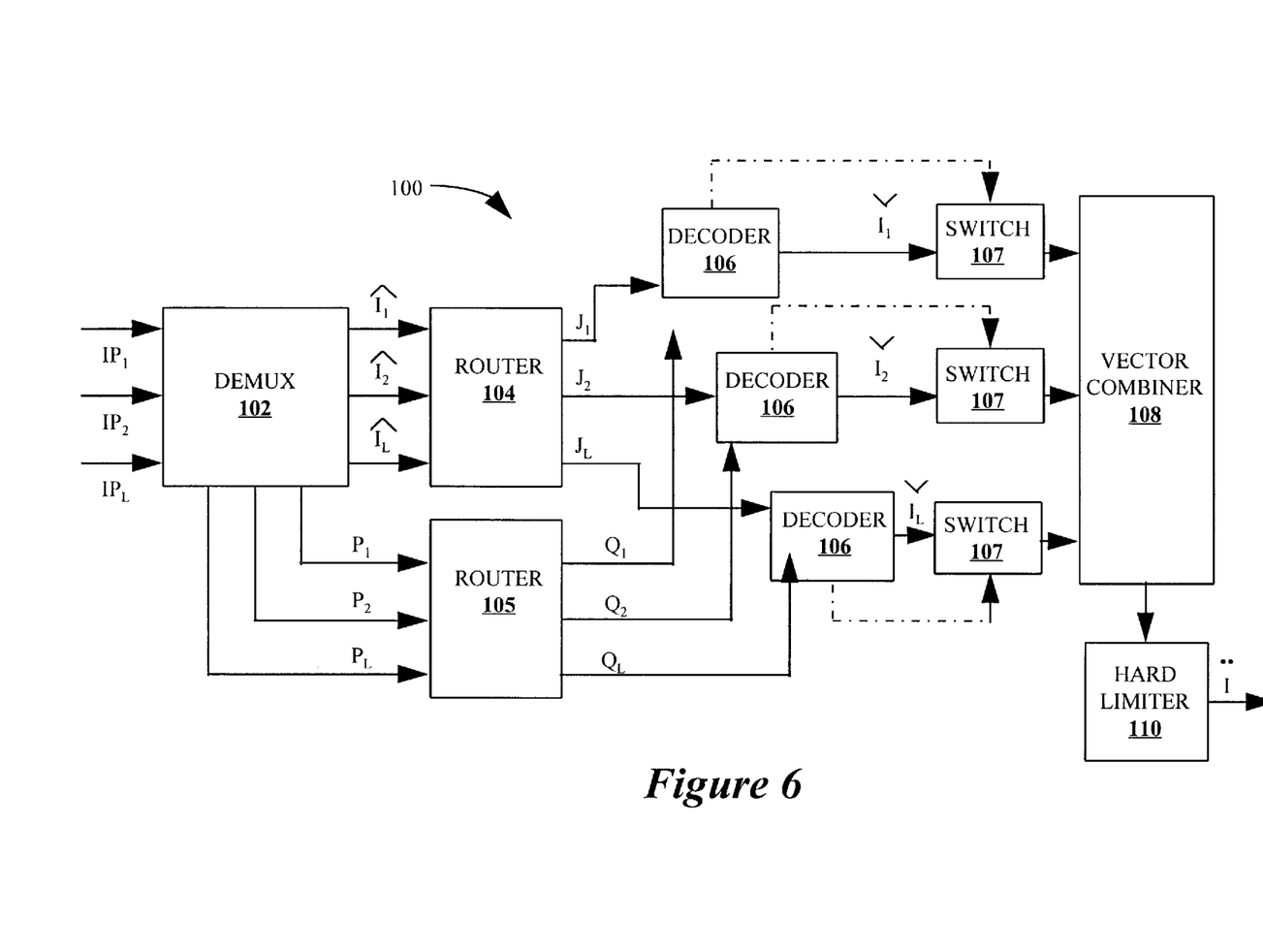
FIG. 6 is a block diagram showing another alternate design for the receiver decoder using a parallel block coding scheme.

Referring now to FIGS. 5 and 6, there is shown a receiver decoder 100 that uses a parallel coding scheme. The parallel coding scheme considered is limited to systematic error control codes that are repeated at the receiver through some diversity means. The repetition may be in time (TDMA), frequency bands (FDMA), or other orthogonal means (CDMA). Alternatively, the receiver code see the independently derived versions of the same transmitted code word by use of antenna diversity.

As shown in FIGS. 5 and 6, the received signal is comprised of the same information sequence I repeated L times with parity checks $P_1,P_2 \ldots P_L$. The parity checks $P_1, P_2 \ldots P_L$ may result from the same code or from different codes. The received code words $IP_1,IP_2 \ldots IP_L$ are fed after demodulation to a demultiplexer 102. The demultiplexer 102 separates the received parity vectors $P_1,P_2 \ldots P_L$ from the received information vectors.

In the embodiment shown in FIG. 5, the information vectors are then fed to a vector combiner 104 and are combined used soft combining or hard combining techniques. Soft combining of the received information vectors may be carried out using a variety of diversity combining techniques. Hard combining is equivalent to a majority vote on the bit level. Since combining techniques are well known to those skilled in the art, they are not described in detail herein. The resulting information vector $\hat{I}$ is then fed to a series of parallel decoders along with the individual parity vectors $P_1,P_2 \ldots P_L$. The information vector $\hat{I}$ is then individually decoded with each of the received parity vectors. The resulting estimates of the information sequence $\check{I}$ are then fed to a second vector combiner 108 to be combined using either hard or soft combining techniques. Switches 107 allow the outputs of the decoders 106 to be passed selectively. For example, if the reliability of a soft decoder 106 is less than a predetermined value, the switch 107 can be turned off by the decoder 106. The output of the vector combiner 108 is passed to the hard limiter 110.

In the embodiment shown in FIG. 6, the vector combiner 104 is eliminated and is replaced by two routers 105. The routers 105 allow the inputs to be directed to any decoder 106. Thus, an information vector $\hat{I}_1$-$\hat{I}_L$ can be decoded using any redundancy vector $\hat{P}_1$-$\hat{P}_L$. The outputs $J_1$-$J_L$ may correspond to different inputs $\hat{I}_1$-$\hat{I}_L$ or may all be the same. Similarly, the outputs $Q_1$-$Q_L$ may correspond to different inputs $\hat{P}_1$-$\hat{P}_L$ or may be the same. As in the previous embodiment, each decoder 106 generates an estimate $\hat{I}$ of the information sequence. The estimates $\hat{I}$ are combined by the vector combiner 108. Switches 107 allow the decoders 106 to be selectively passed to the vector combiner 108.

The nested coding scheme provides an effective method for error control without increasing coding overhead. The nested block code scheme can have a code rate of ⅓ or ¼ and is more flexible than some prior art schemes. The parallel coding scheme also provides a great deal of flexibility to the decoder.

The present invention may, of course, be carried out in other specific ways than those herein set forth without parting from the spirit and essential characteristics of the invention. The present embodiments are, therefore, to be considered in all respects as illustrative and not restrictive, and all changes coming within the meaning and equivalency range of the appended Claims are intended to be embraced therein.

We claim:

1. A method for decoding a received code word comprising:
   (a) decoding said received code word in a first stage of a decoder to obtain a first estimate of the code word;
   (b) decoding said first estimate of the code word in a second stage of said decoder to obtain a second estimate of the code word;
   (c) evaluating the distance between said first and second estimates; and
   (d) erasing said received code word if the evaluated distance between said first and second estimates exceeds a predetermined reference distance.

2. The method according to claim 1 wherein said first stage of said decoder soft decodes said received code word to obtain said first estimate.

3. The method according to claim 2 wherein said second stage of said decoder hard decodes said first estimate to obtain said second estimate.

4. The method according to claim 1 wherein said decoder uses a Golay code.

5. A coding system for error protecting digital information transmitted from a transmitter station and received at a receiver station, comprising:
   (a) a transmitter encoder in said transmitter station for coding an information block of said digital information, said transmitter encoder including:
      (1) an information encoder for coding an information block of said digital information to produce an information code word including an information vector and a primary redundancy vector;
      (2) a redundancy encoder for coding said primary redundancy vector to produce a redundancy code word including said primary redundancy vector and a secondary redundancy vector;
   (b) a receiver decoder in said receiver station for decoding a received information code word and for selectively erasing said received information code word, said receiver decoder including:
      (1) a primary information decoder for decoding said received information code word to produce an initial estimated information vector;
      (2) a redundancy decoder for decoding a received redundancy code word to produce an estimated primary redundancy vector;
      (3) a secondary information decoder for decoding an initial estimated code word including said initial estimated information vector and said estimated primary redundancy vector to produce a subsequent estimated code word;
      (4) a comparison test where said initial estimated code word and said subsequent estimated code word are compared;
      (5) wherein said receiver decoder selectively erases said received code word based on said comparison of said initial estimated code word and said subsequent estimated code word.

6. The coding system of claim 5, wherein said information encoder codes said information block using a Golay code.

7. The coding system of claim 5, wherein said redundancy encoder codes said primary redundancy vector using a Golay code.

8. The coding system of claim 5, wherein said primary information decoder soft decodes said received information code word.

9. The coding system of claim 5, wherein said redundancy decoder soft decodes said received redundancy code word.

10. The coding system of claim 5, wherein said comparator compares said initial estimated code word and said subsequent estimated code word by determining the distance between said initial estimated code word and said subsequent estimated code word and comparing said determined distance with a predetermined reference distance.

11. The coding system of claim 10, wherein said receiver decoder erases said received code word in response to said comparator making an error determination when said determined distance exceeds said predetermined reference distance.

12. A coding method for error protecting digital information transmitted from a transmitter station and received at a receiver station, comprising:
   (a) coding an information block of said digital information at said transmitter station to produce an information code word including an information vector and a primary redundancy vector;
   (b) coding said primary redundancy vector to produce a redundancy code word including said primary redundancy vector and a secondary redundancy vector;
   (c) transmitting said information code word and said redundancy code word;
   (d) receiving said transmitted information code word and said transmitted redundancy code word at said receiver station;
   (e) decoding said received information code word to produce an initial estimated in formation vector;
   (f) decoding said received redundancy code word to produce an estimated primary redundancy vector;
   (g) decoding an initial estimated code word including said initial estimated information vector and said estimated primary redundancy vector to produce a subsequent estimated code word;
   (h) comparing said initial estimated code word and said subsequent estimated code word;
   (i) selectively erasing said received code word based on said comparison of said initial estimated code word and said subsequent estimated code word.

13. The coding method of claim 12, wherein said information block is coded using a Golay code.

14. The coding system of claim 12, wherein said redundancy encoder codes said primary redundancy vector using a Golay code.

15. The coding system of claim 12, wherein said primary information decoder soft decodes said received information code word.

16. The coding system of claim 12, wherein said redundancy decoder soft decodes said received redundancy code word.

17. The coding system of claim 12, wherein said comparator compares said initial estimated code word in said subsequent estimated code word by determining the distance between said initial estimated code word and said second estimate code word and comparing said determined distance with a predetermined reference distance.

18. The coding system of claim 17, wherein said receiver decoder erases said received code word in response to a determination that said determined distance exceeds said predetermined reference distance.

19. A coding system, comprising:

(a) a transmitter encoder for coding an information block to produce an information code word including an information vector and a primary redundancy vector, and for coding said primary redundancy vector to produce a redundancy code word including said primary redundancy vector and a secondary redundancy vector;

(b) a transmitter for transmitting said information code word and said redundancy code word;

(c) a receiver for receiving said transmitted redundancy code word and information code word;

(d) a receiver decoder for producing an initial estimated code word in response to said received information code word and a subsequent estimated code word in response to said received redundancy code word and said initial estimated code word, said receiver decoder comparing said initial estimated code word and said subsequent estimated code word and selectively erasing said receive code word based on said comparison of said initial estimated code word and said subsequent estimated code word.

20. The coding system of claim 19, wherein said transmitter encoder codes said information block using a Golay code.

21. The coding system of claim 19, wherein said receiver decoder soft decodes said received information code word and said received redundancy code word.

22. The coding system of claim 19, wherein said receiver decoder compares said initial estimated code word and said subsequent estimated code word by determining the distance between said initial estimated code word in said subsequent estimated code word in comparing said determined distance with a predetermined reference distance.

23. The coding system of claim 22, wherein said receiver decoder erases said received code word in response to a determination that said determined distance exceeds said predetermined reference distance.

24. A method for decoding a received codeword repeated at a receiver station through diversity means, wherein each repetition of the received codeword includes an information vector and redundancy vector, said method comprising:

(a) inputting one or more of said information vectors in said received codewords to a series of parallel decoders;

(b) inputting one or more of said redundancy vectors in said received codewords to said parallel decoders;

(c) decoding the information vectors separately in said parallel decoders to generate a plurality of estimates of the information sequence; and (d) combining at least two estimates of the information sequence to generate a composite estimate.

25. The method according to claim 24 wherein said information vectors are combined to generate a composite information vector, and wherein said composite information vector is input to each of said parallel decoders.

26. The method according to claim 24 wherein said decoders are soft decoders.

27. The method according to claim 26 wherein the estimates produced by said parallel decoders are selectively combined based upon the reliability of the decoded information sequence.

* * * * *